United States Patent [19]

Poplin

[11] Patent Number: 5,329,260
[45] Date of Patent: Jul. 12, 1994

[54] NUMERICALLY-CONTROLLED MODULATED OSCILLATOR AND MODULATION METHOD

[75] Inventor: Dwight D. Poplin, Salem, Oreg.

[73] Assignee: II Morrow Inc., Salem, Oreg.

[21] Appl. No.: 916,190

[22] Filed: Jul. 17, 1992

[51] Int. Cl.$^5$ .......................... H03C 3/00; H03C 5/00
[52] U.S. Cl. .................... 332/119; 332/144; 332/145; 332/151; 455/102; 455/110
[58] Field of Search .................... 331/46, 47; 332/108, 332/112, 119, 144, 145, 151, 149; 364/718, 721, 851, 852, 858; 455/102, 110

[56] References Cited

U.S. PATENT DOCUMENTS

| | | | |
|---|---|---|---|
| 3,633,017 | 1/1972 | Creeke | 364/721 |
| 3,735,269 | 5/1973 | Jackson | 328/14 |
| 3,742,197 | 6/1973 | Pommerening | 364/718 |
| 3,772,681 | 11/1973 | Skingle | 364/718 |
| 3,973,209 | 8/1976 | Nossen et al. | 328/14 |
| 4,003,003 | 1/1977 | Haeberlin | 332/119 |
| 4,021,757 | 5/1977 | Nossen | 332/101 |
| 4,114,110 | 9/1978 | Nossen | 331/2 |
| 4,114,189 | 9/1978 | Davis | 364/718 |
| 4,134,072 | 1/1979 | Bolger | 328/14 |
| 4,159,527 | 6/1979 | Yahata et al. | 364/721 |
| 4,241,308 | 12/1980 | Cellier et al. | 328/55 |
| 4,249,447 | 2/1981 | Tomisawa | 364/721 |
| 4,259,648 | 3/1981 | Farrow | 332/101 |
| 4,283,768 | 8/1981 | Scott | 328/14 |
| 4,342,245 | 8/1982 | Gross | 364/718 |
| 4,438,503 | 3/1984 | White et al. | 364/721 |
| 4,486,846 | 12/1984 | McCallister | 364/607 |
| 4,494,073 | 1/1985 | Sorgi | 328/14 |
| 4,514,696 | 4/1985 | Genrich | 328/14 |
| 4,516,084 | 5/1985 | Crowley | 331/2 |
| 4,558,282 | 12/1985 | Lowenschuss | 328/14 |
| 4,584,540 | 4/1986 | DuBose et al. | 375/44 |
| 4,603,393 | 7/1986 | Laurent et al. | 364/481 |
| 4,625,318 | 11/1986 | Snyder | 375/46 |
| 4,628,286 | 12/1986 | Nossen | 332/100 |
| 4,636,734 | 1/1987 | Genrich | 328/55 |
| 4,652,832 | 3/1987 | Jasper | 328/14 |
| 4,672,634 | 6/1987 | Chung et al. | 315/62 |
| 4,686,688 | 8/1987 | Chung et al. | 375/47 |

(List continued on next page.)

*Primary Examiner*—Robert J. Pascal
*Assistant Examiner*—Arnold Kinkead
*Attorney, Agent, or Firm*—William A. Birdwell & Associates

[57] ABSTRACT

A numerically-controlled modulated oscillator and modulation method which selectively provides frequency modulation, phase modulation or amplitude modulation with minimal circuitry. A numerically-controlled modulated oscillator is provided having a tuning register for receiving a center frequency parameter, an adder for receiving at one input the frequency parameter, a phase accumulator for receiving a phase increment number from the adder and producing a waveform phase number, a waveform memory for producing a waveform amplitude number in response to the phase number, and a digital-to-analog converter for producing an analog signal in response to the waveform amplitude number. Another input is provided to the adder from an angle modulation register which provides an angle modulation parameter. This parameter can perform either phase or frequency modulation. In the case of frequency modulation, the angle modulation represents the current amplitude of the modulation signal and is added to the center frequency parameter on every clock cycle. In the case of phase modulation, the angle modulation parameter is provided at a periodic rate and then for only one clock cycle. In this case, the value of the angle modulation parameter is relative to the previous angle modulation parameter. Amplitude modulation is provided by an amplitude modulation register which receives an amplitude modulation parameter and applies it to a multiplier disposed between the waveform memory and the digital-to-analog converter.

18 Claims, 3 Drawing Sheets

U.S. PATENT DOCUMENTS

| | | | |
|---|---|---|---|
| 4,745,566 | 5/1988 | Ciardi | 331/1 A |
| 4,746,880 | 5/1988 | McCune | 332/119 |
| 4,750,192 | 6/1988 | Dzung | 375/67 |
| 4,752,902 | 6/1988 | Goldberg | 364/721 |
| 4,792,914 | 12/1988 | Dartois et al. | 328/14 |
| 4,806,881 | 2/1989 | Ives et al. | 332/108 |
| 4,873,500 | 10/1989 | Genrich | 332/104 |
| 4,926,130 | 5/1990 | Weaver | 364/721 |
| 4,951,004 | 8/1990 | Sheffer et al. | 364/721 |
| 4,951,237 | 8/1990 | Essenwanger | 364/721 |
| 4,984,186 | 8/1990 | Moerder | 364/721 |
| 4,992,743 | 2/1991 | Sheffer | 328/14 |
| 4,998,072 | 3/1991 | Sheffer | 328/14 |
| 5,008,629 | 4/1991 | Ohba et al. | 328/14 |
| 5,014,231 | 5/1991 | Reinhardt et al. | 364/718 |
| 5,016,259 | 5/1991 | Hershberger | 328/14 |
| 5,019,785 | 5/1991 | Fognini et al. | 331/18 |
| 5,028,887 | 7/1991 | Gilmore | 364/718 |
| 5,029,120 | 7/1991 | Brodeur et al. | 379/361 |
| 5,034,977 | 7/1991 | Chen et al. | 379/361 |
| 5,045,799 | 9/1991 | Holeck | 328/14 |
| 5,054,039 | 10/1992 | Blackman et al. | 377/42 |
| 5,055,708 | 10/1991 | Sugawara | 307/270 |
| 5,055,801 | 10/1991 | Koya et al. | 331/14 |
| 5,084,681 | 1/1992 | Kovalick et al. | 328/14 |

NUMERICALLY-CONTROLLED MODULATED OSCILLATOR AND MODULATION METHOD

BACKGROUND OF THE INVENTION

This invention relates in general to digital waveform synthesizers and in particular to waveform synthesizers for producing a waveform having angle modulation of a selected type using integrated circuitry of minimal complexity.

In the communications industry it is often desirable to generate a signal that is selectively modulated either by frequency modulation or phase modulation, both of which are types of angle modulation, or by amplitude modulation. This is because the signal propagation conditions at any given time affect the degree to which one type of modulation produces more favorable information transfer results than another. Thence, a communication system that can switch to the most favorable type of modulation for the current propagation conditions can optimize the rate and accuracy of information transfer over a communications channel.

In addition, it is often desirable in modern communication systems to generate a signal by digital waveform synthesis. This is because digital waveform synthesizers provide excellent frequency stability, waveform control and modulation flexibility.

Digital waveform generators of the prior art typically generate a sequence of digital numbers representative of the change in phase of the signal to be produced for each pulse of a periodic clock signal, that is, the frequency of the waveform, which numbers are accumulated to produce a corresponding sequence of digital numbers representative of the phase of the waveform. The phase numbers are typically applied to a phase-to-amplitude conversion means to produce a sequence of digital numbers representative of waveform amplitude. For example, the phase-to-amplitude conversion means may be a memory which stores a sequence of numbers representative of the amplitude of a sinusoid corresponding to phase numbers ranging from 0 degrees to $2\pi$ radians of phase. The output of the memory, or other phase-to-amplitude conversion means, is applied to a digital-to-analog converter, whose output is filtered, to produce an analog transmission signal.

A typical prior art system which permits modulation of a digitally-synthesized waveform employs: (1) a first register for receiving a digital number representative of the center frequency of the output waveform; (2) a second register for receiving a digital number representative of the amount of frequency modulation; (3) a first adder for adding the number in the first register to the number in the second register to produce a digital number representative of the phase increment of the signal to be produced for each clock pulse; (4) an accumulator for receiving and accumulating the phase increment numbers to produce a sequence of digital numbers representative of phase; (5) a third register for receiving a digital number representative of the amount of phase modulation; (6) a second adder for adding the number in the third register to the phase numbers to produce, for each clock pulse, a number representative of the phase of the modulated waveform to be generated; (7) a means for producing a number representative of waveform amplitude for each waveform phase number; (8) a fourth register for receiving a digital number representative of the amount of amplitude modulation; (9) a multiplier for multiplying the waveform amplitude number by the amplitude modulation number to produce a number representative of the amplitude of a modulated digital signal; (10) a digital-to-analog converter; and (11) a filter for producing an analog signal corresponding to the amplitude-modulated digital signal. Examples of such systems can be found in Crooke U.S. Pat. No. 3,633,017 entitled "Digital Waveform Generator" and McCune, Jr. U.S. Pat. No. 4,746,880 entitled "Number Controlled Modulated Oscillator". However, such systems have a significant drawback in that they require an adder after, as well as before, the phase accumulator to accomplish both types of angle modulation, that is, phase modulation and frequency modulation. This takes up more space than a single adder when such an oscillator is fabricated on a single integrated circuit.

In practice, the modulation signal in such systems is frequently generated by a microprocessor or by a digital state machine. In such cases, the modulation signal is not an analog signal but a digital signal which is sampled at the modulation sample. For example, in a multilevel symbol modulation scheme, the modulation sample rate is the symbol rate times a predetermined number of samples per symbol. A digital state machine which generates a modulation signal with a predetermined number of samples per symbol is disclosed in Genrich U.S. Pat. No. 4,873,500 entitled "Phase Accumulation Continuous Phase Modulator". In systems where the modulation is presented as a sequence of digital numbers, it is desirable to load these numbers into the modulator synchronously at a periodic rate. Any variation in the rate at which these numbers are loaded degrades the modulated waveform.

One method for permitting the selection of either frequency modulation or phase modulation in a digital waveform synthesis system while eliminating the need for an adder after the accumulator for phase modulation is to use only one adder before the accumulator, but to control how the adder is used. A system of this type is shown in Ciardi U.S. Pat. No. 4,745,566 entitled "Angle Modulated Waveform Synthesizer". However, the system in Ciardi has two significant drawbacks which prevent it from providing waveform generation in a communication system using minimal circuitry. First, Ciardi discloses a signal generation device which provides a carrier signal angle modulated by a sine wave signal, rather than by a non-periodic signal as would be the case in a communication system. Second, while Ciardi selectively permits either frequency or phase modulation using only one adder which is placed in front of the accumulator, it uses more complex circuitry than is necessary. That is, for both frequency and phase modulation it employs a delay register and an arithmetic-logic unit connected to the adder, and for frequency modulation it requires a divider as well.

Therefore, it would be advantageous to have a simpler circuit architecture which selectively provides either frequency or phase modulation using only one adder in front of an accumulator and which is adapted for use in modulating a carrier signal with a non-periodic modulation signal generated by a microprocessor rather than merely a sine wave. Furthermore, it would be advantageous to have a circuit architecture which allows each number in a sequence of phase modulation or frequency modulation numbers to be synchronously loaded into the circuit by a periodic signal at a predetermined rate.

SUMMARY OF THE INVENTION

The present invention overcomes the disadvantages of prior art digital waveform synthesizers by providing a simplified circuit and method for selectively modulating a waveform either by frequency modulation or phase modulation. The circuit employs a first register for producing a digital number representative of the center frequency of the output waveform, a second register for producing a second digital number representative of the relative amount of modulation, an adder for adding the number in the first register to the number in the second register to produce a digital number representative of the change of phase of the signal to be produced for each clock pulse, a phase accumulator responsive to the output of the adder for producing a sequence of phase numbers, a phase-to-amplitude conversion means responsive to the output of the phase accumulator for producing a sequence of waveform amplitude numbers in response to the phase numbers, and a digital-to-analog converter and filter responsive to the output of the memory for producing an analog signal.

The second register has associated logic circuitry which selectively determines whether it causes frequency modulation or phase modulation. In the case of frequency modulation a sequence of digital numbers representing the amount of modulation is presented to the input of the second register. Each number is loaded into the register at periodic intervals. The second number is continuously added to the first number on every clock cycle until the next frequency modulation number is loaded into the second register. In the case of phase modulation, a sequence of digital numbers representing the amount of modulation is also presented to the input of the second register. Each number is loaded into the register at periodic intervals. Each second number is added to the first number on the first clock cycle after the second number is loaded. The second register is then cleared until the next phase modulation number is loaded into the second register. Moreover, the number loaded into the second register is chosen relative to the prior number loaded into the second register.

The circuit may also be equipped with a third register for producing a digital number representative of the amount of amplitude modulation, where desired. In that case, a multiplier is disposed between the output of the phase-to-amplitude conversion means and the digital-to-analog converter for receiving the number in the third register and multiplying it by the amplitude number for amplitude modulation.

The circuit is particularly adapted to work with a microprocessor, each of the first, second and third registers, and the logic circuitry associated with the second register, being equipped to receive data and control signals from the microprocessor. In the case of phase modulation, the digital number representing the amount of modulation loaded into the second register is computed, relative to the previous number, by the microprocessor.

Accordingly, it is a principal object of the present invention to provide a novel and improved numerically-controlled modulated oscillator and modulation method.

It is another object of the present invention to provide such an oscillator and method that is particularly adapted for communication applications.

It is a further object of the present invention to provide such an oscillator which allows numbers representing a modulation signal to be added for a selected time interval to periodic numbers representing a waveform to be modulated.

It is yet another object of the present invention to provide such an oscillator and method wherein either of frequency modulation or phase modulation may be selected using minimal circuitry.

It is yet a further object of the present invention to provide such an oscillator and method particularly adapted for use with a microprocessor.

The foregoing and other objects, features, and advantages of the invention will be more readily understood upon consideration of the following detailed description of drawings.

DETAILED DESCRIPTION OF THE INVENTION

Figure 1:
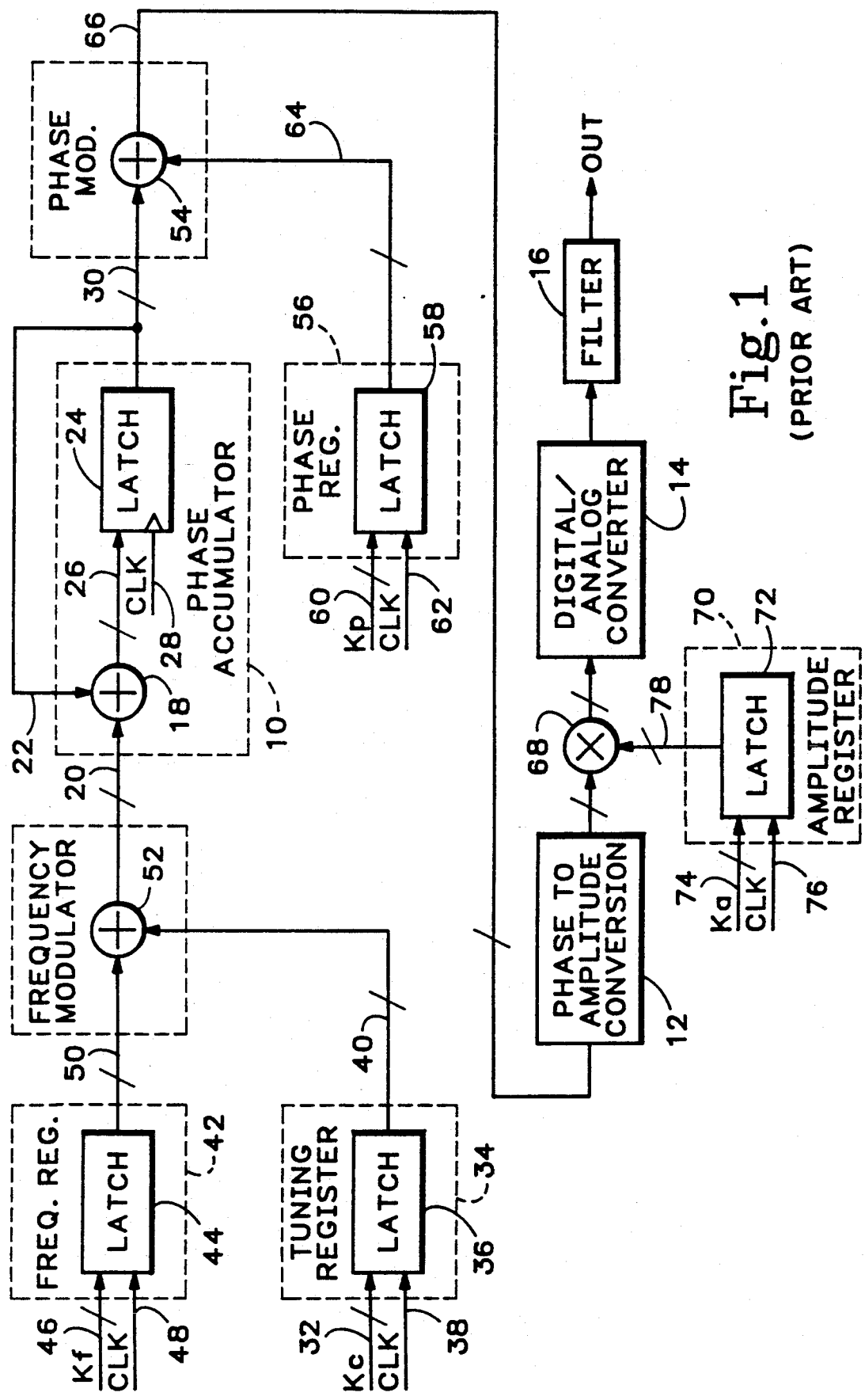
FIG. 1 shows a block diagram of a typical prior art numerically-controlled modulated oscillator for communication applications that selectively permits any of frequency, phase or amplitude modulation.

Refer first to FIG. 1, which shows a typical prior art numerically-controlled modulated oscillator. A basic oscillator of this type comprises a phase accumulator 10, which receives as an input a digital phase-increment number representative of the change in phase of a waveform to be generated and produces an output digital phase number representative of the phase of the waveform, a phase-to-amplitude conversion means 12, typically a waveform memory, which stores or generates data representative of waveform amplitude as a function of phase and produces a digital amplitude number representative of waveform amplitude in response to a phase number applied to its input, a digital-to-analog converter 14 which converts a digital amplitude number to an analog representation thereof, and a filter 16 which eliminates unwanted frequencies that are artifacts of the digital signal synthesis process. Ordinarily, the phase increment number applied to the phase accumulator 10 is a fixed increment representative of the frequency of the signal to be generated and the data produced by the phase-to-amplitude conversion means represents a sinusoid.

A typical phase accumulator comprises a phase increment adder 18, having a phase increment input 20 and a feedback input 22, and a register, comprising latch 24, having a phase sum input 26, a clock input 28 and a phase output 30. On each application of a clock pulse to the clock input 28 of the latch 24, a digital number applied to the phase sum input 26 of the latch 24 is loaded into the latch and replaces whatever number was previously stored in the latch. The number stored in the latch appears at its output 30, as is commonly understood in the art. The phase output 30 is connected to the feedback input 22 so that the digital number applied to the phase increment input 20 of the adder is added to the current digital phase number produced at the phase output 30 to produce a new phase sum number that is loaded into the latch 24 by the next clock pulse, thereby advancing the phase of the waveform. The number generated by the phase accumulator varies over a range from 0 to $2^M$ where M is the number of bits in the accumulator. This range from 0 to $2^M$ corresponds to a phase of the output waveform from 0 to $2\pi$ radians, as is commonly understood in the art.

In such an oscillator the center frequency of the waveform generated is determined by a digital center frequency word $K_c$ loaded into the frequency input 32 of a tuning register 34. The tuning register comprises a latch 36 which also has a clock input 38, whereby the center frequency word $K_c$ applied to input 32 is loaded into the latch 36 by the next clock pulse and, thence, appears at the output 40. The center frequency word $K_c$ is actually a digital number corresponding to a periodic increment in the phase of the waveform to be generated, so that the larger the number, the greater the periodic changes in the phase number applied to the phase-to-amplitude conversion means 12 and, concomitantly, the higher the frequency. Of course, the lower the center frequency word $K_c$, the lower the frequency. The center frequency word $K_c$ is also referred to herein as the "tuning parameter."

Frequency modulation is accomplished by adding to, or subtracting from, the tuning parameter $K_c$ another number on each clock cycle, thereby increasing or decreasing the phase increment number applied to the phase increment input 20 of the phase accumulator 10. It follows that this increases or decreases, respectively, the frequency of the waveform generated. The number added to or subtracted from the tuning parameter $K_c$ is a digital number known as the "frequency modulation parameter" $K_F$.

In a conventional oscillator, a frequency modulation register 42 is provided, comprising a latch 44 having a frequency modulation input 46 to which the frequency modulation parameter $K_F$ is applied, a clock input 48 and an output 50. On each clock pulse the digital number representing the current frequency modulation parameter is loaded into the latch 44 and appears at its output 50. An adder 52 adds the digital number at the output 50 of the frequency register 42 to the digital number at the output of the tuning register 34, ordinarily using two's complement for subtraction, and applies the sum to the phase increment input 20 of the phase accumulator 10 to accomplish frequency modulation. While the tuning parameter $K_c$ remains constant, the frequency modulation parameter $K_F$ ordinarily varies at a periodic rate in accordance with the amplitude of a modulation signal. The periodic rate at which the modulation parameter varies is referred to herein as the modulation sample rate. In the case of digital, sampled multi-level symbol modulation schemes, such as digital four-level angle modulation, for example, the modulation sample rate is the symbol rate times the number of samples per symbol. Of course, if $K_F$ is held at zero, there will be no frequency modulation.

In conventional numerically-controlled modulated oscillators, phase modulation is typically accomplished using an adder 54 disposed between the phase output 30 of the phase accumulator 10 and the phase-to-amplitude conversion means 12, so as to vary the phase with each clock cycle in accordance with a digital number known as the "phase modulation parameter" $K_P$. A phase modulation register 56 is provided, comprising a latch 58 having a phase modulation input 60 for receiving the phase modulation parameter $K_P$, a clock input 62 and an output 64. On each clock pulse applied to the clock input 62, the phase modulation parameter $K_P$ currently applied to the phase modulation input 60 is loaded into the latch 58 and appears at its output 64. The adder 54 receives the phase number from the output 30 of the phase accumulator and a phase modulation number from the output 64 of the phase modulation register and produces a sum, using two's complement for subtraction, at its output 66, which represents the current phase of the waveform to be generated.

Thence, to accomplish phase modulation, the modulation signal is applied as the phase modulation parameter to the phase modulation input 60 of the phase modulation register 56 and the phase number applied to the phase-to-amplitude conversion means varies with each clock pulse in accordance with the modulation signal. Thence, whether the amount, or amplitude, of the modulation varies or not, the phase number is the sum of the output of the phase accumulator 10 and the current phase modulation parameter $K_P$ for each clock cycle. Of course, if the phase modulation parameter is held at zero, there will be no phase modulation.

In addition, conventional oscillators often provide for amplitude modulation. This is ordinarily accomplished by placing a multiplier 68 between the phase-to-amplitude conversion means 12 and the digital-to-analog converter 14 to multiply the waveform amplitude number produced by the phase-to-amplitude conversion means by a digital number representative of the amplitude of the modulation signal, that is, by a digital number known as the "amplitude modulation parameter" $K_A$. An amplitude register 70 is provided, comprising a latch 72 having an amplitude modulation input 74, a clock input 76 and an output 78. On each clock pulse applied to the clock input 76, the current amplitude modulation parameter is loaded into the latch 72. That value appears as a digital number at the output 78 of the latch 72, and is applied to the multiplier 68, so that it multiplies, and thereby amplitude modulates, the waveform amplitude number produced by the phase-to-amplitude conversion means 12. Of course, if the amplitude modulation parameter $K_A$ is held at one continuously, there will be no amplitude modulation.

Figure 2:
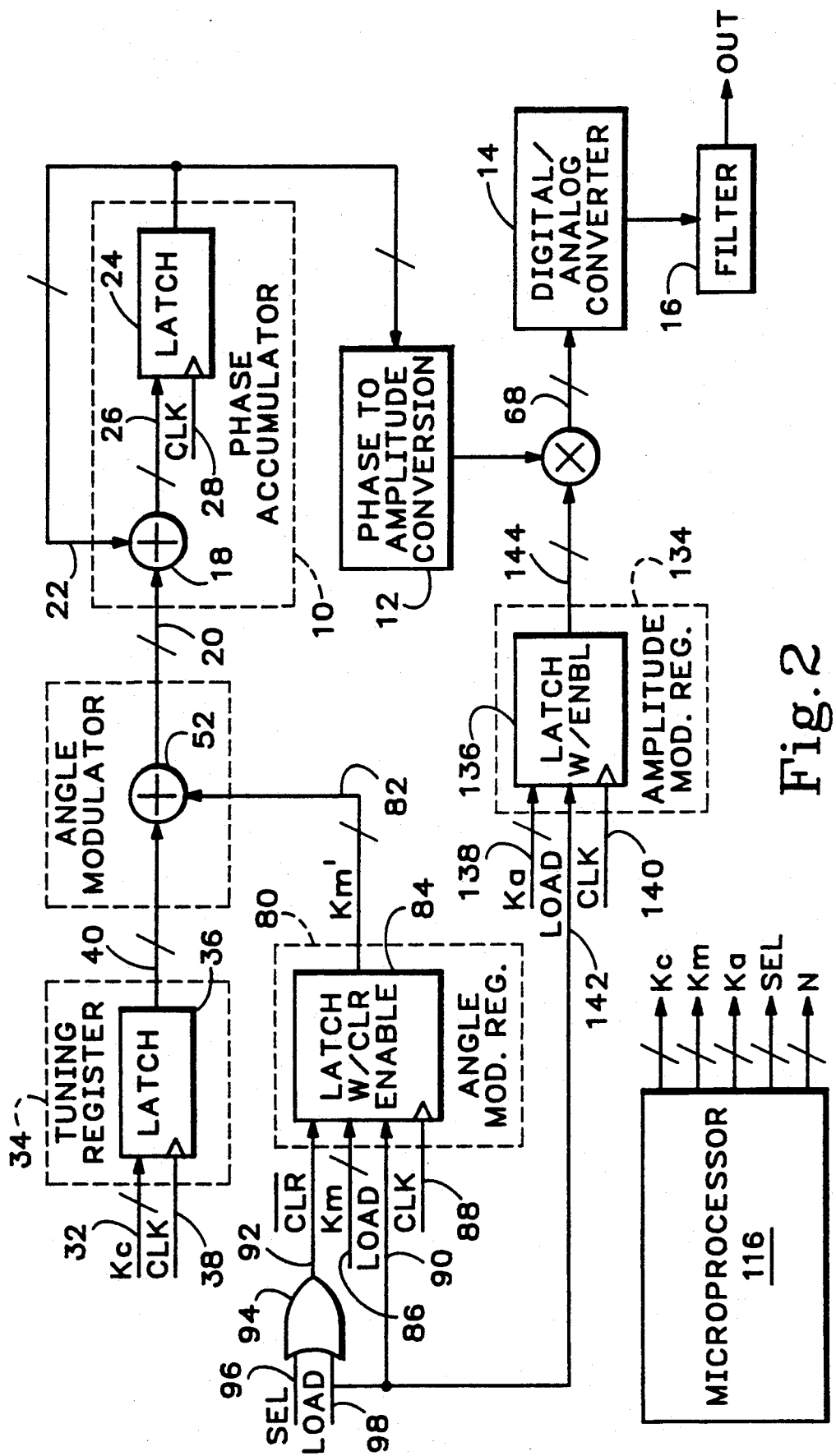
FIG. 2 shows a block diagram of a numerically-controlled modulated oscillator according to the present invention.

Turning now to FIG. 2, the preferred embodiment of the numerically-controlled modulated oscillator according to the present invention also includes some of the same elements discussed above. That is, it includes a tuning register 34, an adder 52, a phase accumulator 10, a phase-to-amplitude conversion means 12, a multiplier 68, a digital-to-analog converter 14 and a filter 16, as described above. Preferably, the phase-to-amplitude conversion means is a random-access waveform memory having an address input and a data output, and which stores data representative of a sinusoid.

However, in the present invention the adder 52 serves as an angle modulator, not merely a frequency modulator, and the rest of the circuitry and operation of the oscillator differ from the conventional oscillator described above. Also, it is to be recognized that variations in the conventional elements may be employed without departing from the principles of the invention whose description follows.

To provide selectively either frequency modulation or phase modulation, the oscillator according to the present invention is provided with an angle modulation register 80, having an output 82 that is applied to an input of the adder 52 so as to be added to the output 40 from the tuning register 34 to produce a phase increment number. The angle modulation register comprises a latch 84, having a modulation input 86 for receiving a digital number referred to herein as an "angle modulation parameter" $K_M$, a clock input 88, a LOAD control signal input 90 and a CLEAR control signal input 92. In the embodiment shown, the LOAD input 90 is "active high", so that when a logic high input is applied to the LOAD input the value of $K_M$ will be transferred to the output 82 on the rising edge of a clock pulse applied to the clock input 88. The CLEAR input 92 is "active low", so that when a logic low input is applied to the CLEAR input the rising edge of a clock pulse will clear the output 82 of the angle modulation register 80.

In addition to the angle modulation register 80, the logic circuitry provided to select between frequency and phase modulation includes an "OR" gate 94. The OR gate has a SELECT control signal input, a LOAD control signal input 98 and an output connected to the CLEAR input 92 of the latch 84. The LOAD input 98 of the OR gate 94 is also connected to the LOAD input 90 of the latch 84, so that a signal applied to the one will also be applied to the other. The control signal applied to the SELECT input 96 of the OR gate 94 determines whether frequency modulation or phase modulation will occur. Frequency modulation is selected if the SELECT signal is high and phase modulation is selected if the SELECT signal is low. In practice, the LOAD signal is low for most of the time and goes high for one clock cycle at a periodic rate determined by the modulation sample rate. The LOAD signal is also referred to herein as a modulation timing signal.

For frequency modulation, the SELECT input is held high, which causes the CLEAR input 92 to the latch 84 to be high at all times. In this mode, the angle modulation register 80 clocks the value of $K_M$ from the modulation input 86 to the output 82 whenever the LOAD input goes high, and holds that output value until the next time the LOAD input goes high. Thence, the current modulation parameter $K_M$ is added to the tuning parameter $K_F$ on each clock cycle, just as in a conventional numerically-controlled modulated oscillator.

For phase modulation, the SELECT input is held low, which causes the CLEAR input 92 to the latch 84 to be low at all times except when the LOAD input 98 to the OR gate and to the latch 84 goes high. Consequently, $K_M$ is clocked to the output 82 of the angle modulation register 80 when the LOAD signal goes high and is held there for a selected period of time determined by the time the LOAD signal stays high, after which that output is cleared to zero. Ordinarily, $K_M$ is held at the output 82 only for one cycle. The output 82 remains at zero until the LOAD signal again goes high. Thence, in this mode, the modulation parameter $K_M$ is added to the tuning parameter $K_F$ only on those clock cycles when the LOAD is high.

Figure 3:
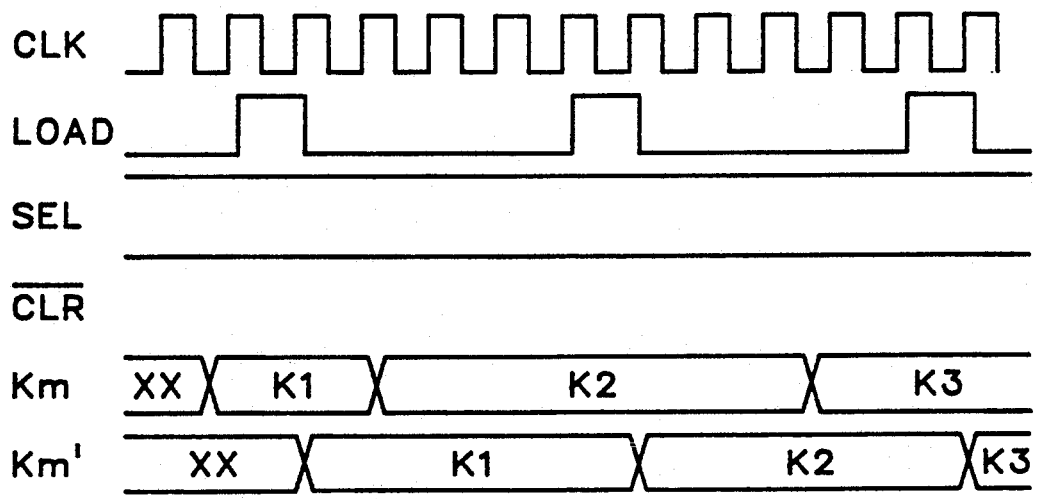
FIG. 3 shows a timing diagram for the oscillator of FIG. 2 when operating in the frequency modulation mode.
Figure 4:
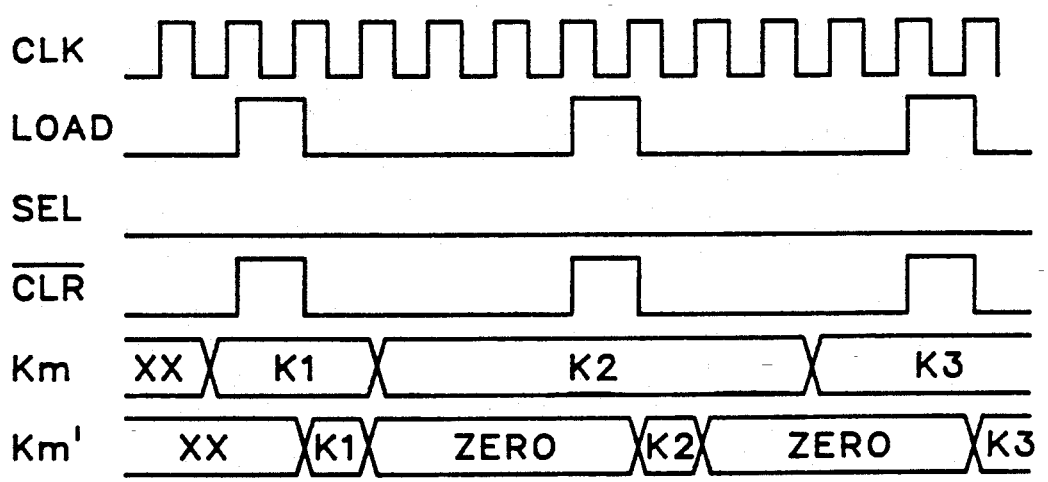
FIG. 4 shows a timing diagram for the oscillator of FIG. 2 when operating in the phase modulation mode.

The operation of the logic circuitry comprising angle modulation register 80 and OR gate 94 can be better understood with reference to FIGS. 3 and 4, which show logic timing diagrams for frequency and phase modulation modes, respectively. In FIG. 3, it can be seen that the SELECT signal is always held high, which causes the $\overline{CLR}$ (not CLEAR) signal to remain high. Thence, $K_M$ is transferred to the output 82, that is, $K_M'$, whenever the LOAD signal is high and the leading edge of a clock ("CLK") pulse occurs. In FIG. 4, it can be seen that the SELECT signal is always held low so that the $\overline{CLR}$ signal goes high when the LOAD signal goes high. Again, whenever the LOAD signal is high and the leading edge of the clock signal occurs, $K_M$ is transferred to $K_M'$; however, the output is then cleared on the following clock cycle.

There is an important difference in the way that the modulation parameter $K_M$ affects the output of the oscillator in phase modulation from the way that the phase modulation parameter $K_P$ affects the output of a conventional oscillator. In the conventional oscillator, $K_P$ causes a phase offset which is relative to the phase of the carrier waveform without phase modulation, and the number applied to $K_P$ is proportional to the amplitude of the modulating signal. In the present invention, in the phase modulation mode, $K_M$ causes a phase offset which is relative to the current phase of the phase modulated carrier. Thence, the phase offset to the original unmodulated carrier waveform is the accumulation of all previous $K_M$ values.

For example, in a conventional oscillator, if $K_P$ is set to 45°, 90° and −45° on consecutive samples, the phase of the carrier waveform will shift consecutively to 45°, 90° and −45°, respectively, relative to the unmodulated carrier. However, to achieve the same result with the oscillator of the present invention, $K_M$ must be set to 45° for the first sample, 45° for the second sample and then to 135° for the third sample. To calculate $K_M$ according to the present invention, the following formula may be used:

$$K_{M(I)} = P_{OFFSET} - \sum_{X=1}^{I-1} K_{M(X)}$$

where $K_{M(I)}$ = the current $K_M$ value to be calculated,
I = the number of $K_m$ values since a predetermined point in time, ordinarily the time when phase modulation first began, $P_{OFFSET}$ = the desired phase offset relative to an unmodulated carrier, and $$\sum_{X=1}^{I-1} =$$

the sum of all previous $K_M$ values since said predetermined point in time.

Figure 5:
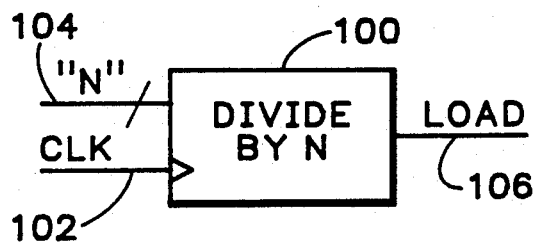
FIG. 5 shows a preferred timing circuit for the oscillator of FIG. 2.

A preferred embodiment of a timing circuit for providing the LOAD signal to the oscillator of the present invention is shown in FIG. 5. It comprises a divide-by-N circuit 100, having a clock input 102, an N input and a LOAD output 106. The divide-by-N circuit divides the clock input by a predetermined number N, provided as a digital number, to produce the periodic LOAD signal which is high for one clock cycle and low for N−1 clock cycles. The divisor N is chosen such that the LOAD signal occurs at the modulation sample rate.

Figure 6:
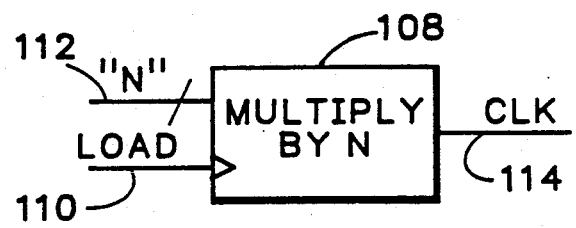
FIG. 6 shows an alternative timing circuit for the oscillator of FIG. 2.

An alternative timing circuit is shown in FIG. 6. In this embodiment, a multiply-by-N circuit 108 takes a LOAD signal input 110 and a multiplier N input 112 and generates a clock signal output 114 with a frequency which is N times the frequency of the load input. In practice, N is chosen to provide a sufficient number of samples of the modulated carrier output for each sample of the modulation signal.

To use the numerically controlled modulated oscillator of the present invention, it is preferably connected to a microprocessor 116 which provides the tuning parameter $K_C$, the angle modulation parameter $K_M$, the amplitude modulation parameter $K_A$, the SELECT signal and the digital number N. In the phase modulation mode the microprocessor computes the modulation parameter $K_M$ relative to the current phase of the modulated waveform.

For example, when the oscillator of the present invention is used with the timing circuit in the preferred embodiment to produce four-level phase modulation, N would be chosen such that the LOAD signal would occur at the modulation sample rate and each symbol sample would provide a potentially new angle modulation parameter $K_M$, depending on whether the sample changes from one sample to the next. Where the symbol has changed, the microprocessor would provide a new modulation parameter representing a change in phase relative to the current phase so that the phase increment during one clock cycle would bring the phase of the modulated waveform to the phase corresponding to that symbol.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. An apparatus for synthesizing a waveform having a selected type of modulation, comprising:
   (a) first means, having a first input for receiving a first number representative of a change in phase of a waveform to be modulated and a second input for receiving a second number representative of a change in phase of said waveform to be modulated in response to a modulation signal, for producing periodically a third number representative of an arithmetic combination of said first number and said second number;
   (b) second means, responsive to said third number, for producing periodically a fourth number, each consecutive fourth number being the sum of the next preceding fourth number and the current said third number; and
   (c) third means, responsive to a fifth number and a modulation timing signal, for selectively producing as said second number, for a selected time interval, said fifth number, upon the occurrence of a predetermined state of said modulation timing signal.

2. The apparatus of claim 1, wherein said first means comprises means for adding said first number to said second number to produce, as said third number, the sum thereof.

3. The apparatus of claim 1, further comprising fourth means for producing said first number in response to a timing signal.

4. The apparatus of claim 1, wherein said third means produces said second number periodically, and said selected time interval is substantially equal to the time during which said second means produces one said fourth number.

5. The apparatus of claim 1, wherein said second means comprises means for adding said third number to the current fourth number to produce a sixth number, and a register, having a data input for receiving said sixth number and a clock input for causing said register to produce as its output a new fourth number equal to said sixth number.

6. The apparatus of claim 1, further comprising phase-to-amplitude conversion means, responsive to said fourth number, for producing in response to each consecutive fourth number a sixth number representative of the amplitude of said waveform corresponding to said fourth number.

7. The apparatus of claim 6, wherein said phase-to-amplitude conversion means comprises memory means having an address input responsive to said fourth number and a data output for producing said sixth number.

8. The apparatus of claim 7, further comprising fifth means, responsive to said sixth number and a seventh number, for multiplying said sixth number by said seventh number.

9. The apparatus of claim 8, further comprising register means, responsive to an eighth number and an amplitude modulation timing signal, for producing as said seventh number said eighth number, upon the occurrence of a predetermined state of said amplitude modulation timing signal.

10. A method for synthesizing a waveform having a selected type of modulation, comprising the steps of:
   (a) producing a first number representative of the change in phase of a waveform to be modulated;
   (b) producing a second number for a time interval;
   (c) producing periodically a third number which is representative of said first number, and during said time interval, an arithmetic combination of said first number and said second number;
   (d) producing periodically a fourth number, each consecutive fourth number being the sum of the next preceding fourth number and the current said third number; and
   (e) selectively varying said time interval so as to determine the type of said modulation.

11. The method of claim 10, wherein said fourth number is produced periodically, and said time interval is substantially equal to the time during which one said fourth number is produced.

12. The method of claim 10, wherein said arithmetic combination is the sum of said first number and said second number.

13. The method of claim 10, further comprising the step of converting said fourth number to a fifth number representative of a waveform amplitude corresponding to said fourth number.

14. The method of claim 13, further comprising multiplying said fifth number by a sixth number representative of the amplitude of a modulation signal to produce a seven number representative of waveform amplitude.

15. An apparatus for synthesizing a waveform having a selected type of modulation, comprising:
   (a) first means, having a first input for receiving a first number representative of a change in phase of a waveform to be modulated and a second input for receiving a second number representative of a change in phase of said waveform to be modulated in response to a modulation signal, for producing periodically a third number representative of an arithmetic combination of said first number and said second number;
   (b) second means, responsive to said third number, for producing periodically a fourth number, each consecutive fourth number being the sum of the next preceding fourth number and the current said third number; and third means, responsive to a fifth number and a modulation timing signal, for producing as said second number, for a selected time interval, said fifth number, upon the occurrence of a predetermined state of said modulation timing signal, said third means including means responsive to a select control signal, for causing said third means to continue to produce said second number beyond said selected time interval when said select control signal is in a predetermined state.

16. The apparatus of claim 15, wherein said third means comprises a register, having a data output for producing said second number, a data input for receiving said fifth number, a load input and a clear input, for transferring a number applied to said data input to said data output in response to a load signal of predetermined state applied to said load input and for clearing said data output in the absence of a clear signal of predetermined state applied to said clear input, and logic means, responsive to said modulation timing signal and said select control signal, for applying to said load input of said register means said load signal of predetermined state in response to said predetermined state of said modulation timing signal and applying to said clear input said clear signal of predetermined state in response to either said predetermined state of said modulation timing signal or a predetermined state of said select control signal.

17. An apparatus for synthesizing a waveform having a selected type of modulation, comprising:
  (a) first means, having a first input for receiving a first number representative of a change in phase of a waveform to be modulated and a second input for receiving a second number representative of a change in phase of said waveform to be modulated in response to a modulation signal, for producing periodically a third number representative of an arithmetic combination of said first number and said second number;
  (b) second means, responsive to said third number, for producing periodically a fourth number, each consecutive fourth number being the sum of the next preceding fourth number and the current said third number;
  (c) third means, responsive to a fifth number and a modulation timing signal, for producing as said second number, for a selected time interval, said fifth number, upon the occurrence of a predetermined state of said modulation timing signal; and
  (d) processor means for producing said second number, whereby said second number is equal to a number representative of a desired change in phase of said waveform to be modulated relative to said first number less the sum of all previous second numbers that have been produced since a predetermined point in time.

18. a method for synthesizing a waveform having a selected type of modulation, comprising the steps of:
  (a) producing a first number representative of the change in phase of a waveform to be modulated;
  (b) producing for a selected time interval a second number;
  (c) producing periodically a third number which is representative of said first number, and during said selected time interval, an arithmetic combination of said first number and said second number;
  (d) producing periodically a fourth number, each consecutive fourth number being the sum of the next preceding fourth number and the current said third number; and
  (e) computing said second number so that it is equal to a desired change in the phase of said waveform to be modulated less the sum of all previous second numbers that have been produced since a predetermined point in time.

* * * * *

UNITED STATES PATENT AND TRADEMARK OFFICE
CERTIFICATE OF CORRECTION

PATENT NO. : 5,329,260
DATED : July 12, 1994
INVENTOR(S) : Dwight D. Poplin

It is certified that error appears in the above-identified patent and that said Letters Patent is hereby corrected as shown below:

In column 4, line 16, after "of" and before "drawings", insert --the invention, taken in conjunction with the accompanying--.

In column 6, line 8, after "62", delete the hyphen.

In column 11, at line 3, before "third" insert --(c)--; and, at line 8, after "means" and before "responsive", insert a comma.

In column 12, at line 20, rewrite "a method" as --A method--.

Signed and Sealed this

Fifteenth Day of August, 1995

Attest:

BRUCE LEHMAN

*Attesting Officer*     *Commissioner of Patents and Trademarks*